United States Patent
Jang et al.

(10) Patent No.: US 6,753,259 B2
(45) Date of Patent: Jun. 22, 2004

(54) METHOD OF IMPROVING THE BONDABILITY BETWEEN AU WIRES AND CU BONDING PADS

(76) Inventors: Syun-Ming Jang, 7Fl., 83 Kuang-hua North St., Hsinchu City (TW); Mong-Song Liang, 5Fl., 9 Lane 116, Sec. 2, Chung-shan North Rd., Taipei (TW); Chen-Hua Yu, 2Fl., 77 Chung-yi St., Chi-tu, Keelung (TW); Chung-Shi Liu, 8Fl.-5, 101 Tzu-yu Rd., Hsinchu City (TW); Jane-Bai Lai, 7 Lane 611, Chung-Cheng Rd., Fengyuan City (TW)

( * ) Notice: Subject to any disclaimer, the term of this patent is extended or adjusted under 35 U.S.C. 154(b) by 40 days.

(21) Appl. No.: 09/972,492

(22) Filed: Oct. 5, 2001

(65) Prior Publication Data

US 2002/0086533 A1 Jul. 4, 2002

Related U.S. Application Data

(62) Division of application No. 09/385,754, filed on Aug. 30, 1999.

(51) Int. Cl.⁷ ............................................. H01L 21/302
(52) U.S. Cl. ...................... 438/692; 438/694; 438/697; 438/698; 438/702
(58) Field of Search ..................... 438/692, 694, 438/697, 699, 702, 695, 704

(56) References Cited

U.S. PATENT DOCUMENTS

| 5,615,387 | A | * | 3/1997 | Crockett et al. | ............... | 29/847 |
| 5,989,992 | A | * | 11/1999 | Yabu et al. | .................. | 438/612 |
| 6,084,304 | A | * | 7/2000 | Huang et al. | ................ | 257/762 |
| 6,174,810 | B1 | * | 1/2001 | Islam et al. | .................. | 438/687 |
| 6,239,494 | B1 | * | 5/2001 | Besser et al. | ................ | 257/762 |

* cited by examiner

*Primary Examiner*—Nadine G Norton
*Assistant Examiner*—Binh X. Tran

(57) ABSTRACT

Cu, for its rather low resistivity, will be widely used in sub-quarter micron meter ULSI devices. However, it is well known that Cu is easy to be corroded as exposed in air. In packaging of chips the bonding pads making of Cu will thus oxides. In addition, the reaction between Au-ball and Cu pads is very poor. On the other hand, a native AlOx layer, about 3–4 nm in thickness, will form as Al exposes in air; the formed layer is inert and is capable of protecting Al from corrosion. Furthermore, the reaction between Au-ball and Al was very well. Therefore, with the methods of the present invention, Al or AlCu as a glue and protection layer is implemented on Cu bonding pads for successful Au wiring.

6 Claims, 4 Drawing Sheets

METHOD OF IMPROVING THE BONDABILITY BETWEEN AU WIRES AND CU BONDING PADS

RELATED APPLICATION

This is a divisional application of prior application Ser. No. 09/385,754 filed Aug. 30, 1999, entitled: METHOD OF IMPROVING THE BONDABILITY BETWEEN Au WIRES AND Cu BONDING PADS.

FIELD OF INVENTION

The present invention relates to the method of improving the bondability in the package of integrated circuit (IC) fabrication, and more particularly to the method of improving the bondability between Au wires and Cu bonding pads in packaging ICs.

BACKGROUND OF THE INVENTION

IC technology has produced dramatic advances over the past 20 years and already entered the sub-quarter submicron generation. The demand for progressively smaller, less expensive, and more powerful electronic products expedites the constant need for smaller geometry integrated circuits, and thus a denser packaging of circuits upon IC substrates. In discovering alternative metallization materials of satisfying the requirement, Cu is by far the most studied substitute for Al. Cu has higher resistivity and heavier atomic weight than Al. However, not like Al growing a passivating oxide in air and naturally protected against corrosion, AlCu alloys and Cu lines used in ULSI circuits have no passivating oxides, and thus they are more vulnerable to corrosion. Cu is electropositive and is relatively not vulnerable to electrochemical corrosion. However, the copper oxide in air increases linearly with time shows the lack of a protective oxide. The lack of a passivating oxide makes Cu more vulnerable to chemical corrosion. Furthermore, the copper oxides is a major factor effecting the bonding quality between Au wires and Cu bonding pads.

On the other hand, in addition to controlling variables of bonding such as bonding temperature, loads, and ultrasonic vibration magnitudes, the major concern in establishing high-quality, reliable wire bonding is the bondability between Au wires, which has been routinely used in packaging wiring, and bonding pads. Cu damascene is attractive for multilevel interconnection and being used in the industry. But due to the poor bondability (reaction) between Au wire and Cu pad, a solutions must be offered for packaging the chips with Cu top metal in wire bonding techniques; otherwise, it invites poor interconnections leading to degraded reliability.

Therefore, the constant effort in the industry is how to improve the bondability between Au wires and Cu bonding pads; however, there is still no breakthrough about this problem.

SUMMARY OF THE INVENTION

It is an object of the present invention to provide an improved method of increasing the bondability between Au wires and Cu pads in packaging of chip. It has been proposed that adding Al or AlCu (Cu up to 1%), which has long been demonstrated compatible with Au wiring, on Cu bond pad. By the methods of the present invention, Al or AlCu as a glue layer can be implemented on Cu bond pad for successful Au wiring. The bonding of Au wire and the bond pad of the chip with Cu top metal is improved.

One embodiment of the present invention further includes introducing a rough surface to the passivation layer, and thus creating the micro-topography which will promote the adhesion of the molding compound to the dielectric. Thermal coefficient expansion (CTE) of the molding compound then will not be so critical in the molding process.

Therefore, one object of the present invention is to provide a Al or AlCu layer upon the Cu bonding pads which acts as a protection layer of the Cu pads and a glue layer between Au wires.

Another object of the present invention is to provide an improved method for increasing the adhesion between the molding compounds and the surface of the passivation layer.

Further object of the present invention is to reduce the manufacturing steps and thus to decrease the complexity and cost.

According to the present invention, a method of improving the bondability between Au wires and copper (Cu) pads used in semiconductor manufacturing process, comprises: forming a Cu bonding pad on the top level of the metallization; chemical mechanical polishing (CMP) said Cu bonding pad; etching back said Cu bonding pad; depositing a barrier layer over said Cu bonding pad; and depositing AlCu or Al over said barrier layer to cover said Cu bonding pads.

According to the present invention, another method of improving the bondability between Au wires and Cu pads, used in semiconductor manufacturing process, comprises: etching a passivation layer to expose the underlying Cu bonding pads of the top level metallization; depositing a tungsten (W) barrier layer upon said Cu bonding pads; and depositing a Al layer on said W barrier layer.

According to the present invention, the method of improving the bondability between Au wires and Cu pads used in semiconductor processing comprises: forming a Cu bonding pad upon the top level metal; depositing a passivation layer over Cu bonding pad of the top level metallization; etching said passivation layer to expose said underlying Cu bonding pad through a contact window; depositing blanket aluminum (Al) on top of said barrier layer, performing Al CMP to remove Al on top of said passivation layer and leave Al only on the bonding pad of said contact window.

Other features and advantages of the present invention will be apparent from the accompanying drawings and from the detailed description that follows below.

BRIEF DESCRIPTION OF DRAWINGS

According to the present invention.

According to the present invention.

According to the present invention.

DETAILED DESCRIPTION OF PREFERRED EMBODIMENTS

EXAMPLE 1

The preferred embodiment is to manufacture a layer of Al or AlCu upon the Cu bonding pads, which is made by means of Cu damascene process on the top metal structure for packaging of chips, in favor of effectively bonding the Au wires.

Figure 1:
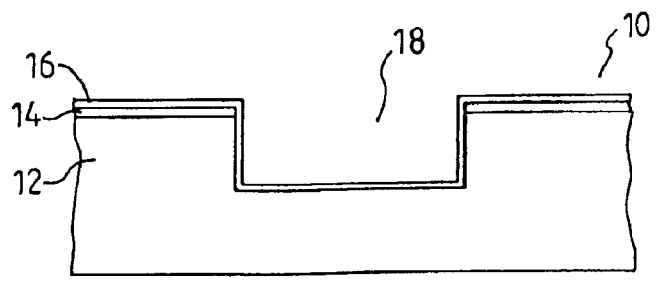
FIG. 1 through FIG. 7 illustrate steps in a method of forming a protection and glue layer of Al or AlCu upon the Cu bonding pads in an integrated circuit.

FIG. 1 is a partial cross-sectional view of IC 10. As shown in FIG. 1, a barrier layer 16 is formed upon the top surface of a nonconductive barrier layer 14 and a dielectric layer 12, including the sidewall surface of the via hole 18.

Figure 2:
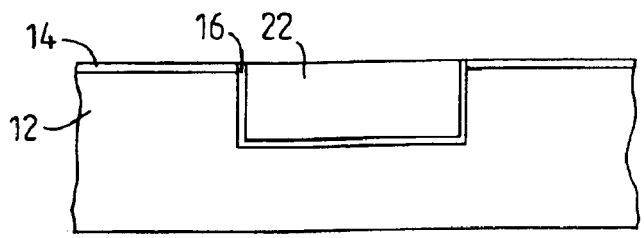

Next, in FIG. 2, the Cu is deposited to fill-in the via hole 18 and form the Cu bonding, pad 22. Subsequently, Cu CMP process is implemented to remove the Cu and the barrier layer 16 over the top surface of nonconductive barrier layer 14, and to planarize the top surface.

Figure 3:
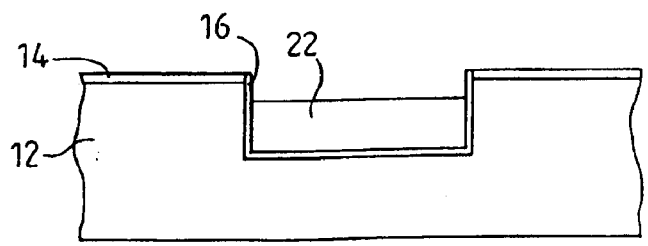

Then the Cu pad 22 within the via hole 18 is etched back by wet or dry process which results in the lower Cu bonding pad than that of dielectric layer, as shown in FIG. 3.

Figure 4:
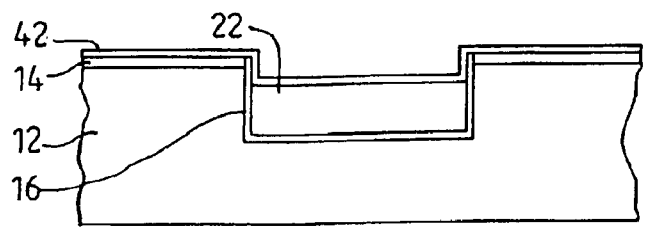

Afterwards, in FIG. 4, the top surface of the Cu bonding pad 22 is depositing by CVD a barrier layer 42, such as TiN, which acts not only as a barrier layer to prevent Cu diffusion but also as a glue layer of both Cu and Al.

Figure 5:
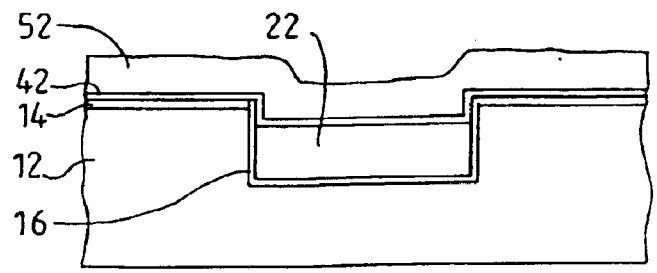

In FIG. 5, a layer of Al or AlCu 52 is deposited by PVD all over the surface of the barrier layer 42, including the area upon the Cu bonding pad 22.

Figure 6:
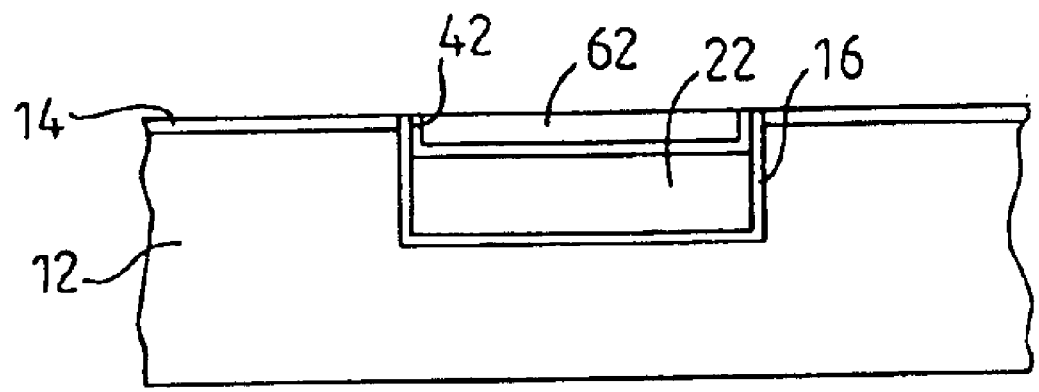

FIG. 6 illustrates a step of Al or AlCu CMP which is employed to remove the Al or AlCu 52 and the barrier layer 42 over the nonconductive layer 14 and planarize the top surface of it.

Figure 7:
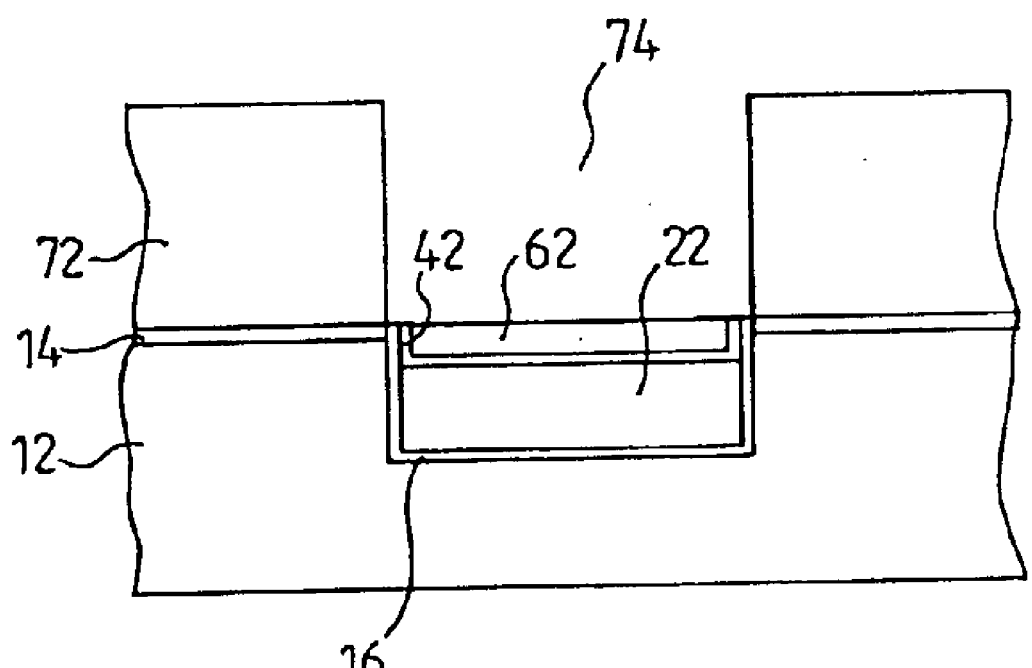

After the CMP planarization, a passivation layer 72, as shown in FIG. 7, is deposited over the nonconductive layer 14, and etched to expose the Cu bonding pad 22 through the contact window hole 74.

An additional polishing step is performed to intentionally introduce surface roughness such as scratches on dielectric surface. (not shown in the figures) The self-aligned process is less expensive than conventional approach; the new process does not need photo and etching steps.

In the embodiment, the deposition of Al or AlCu can be a self-aligned deposition.

EXAMPLE 2

The preferred embodiment is to deposit a layer of Al or AlCu upon the Cu bonding pads, which is made by means of Cu damascene process on the top metal structure for packaging of chips. With the selective growth Al or AlCu glue layer, Au-ball bondability with Cu bonding pads is improved.

Figure 8:
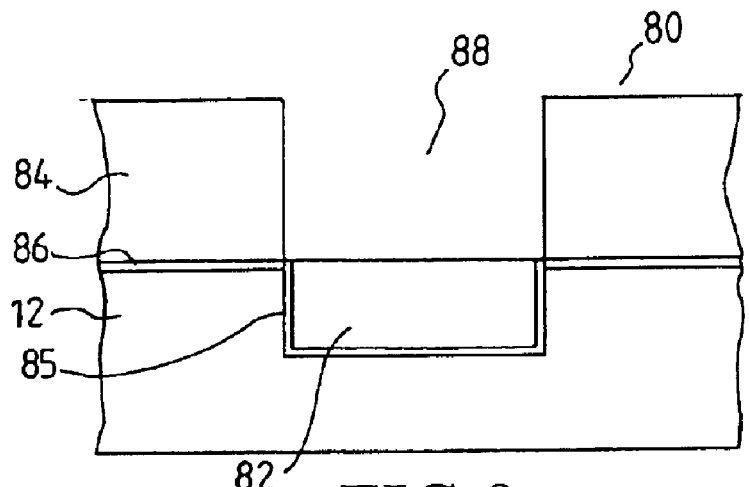
FIG. 8 through FIG. 10 illustrate steps in a method of selectively depositing a protection and glue layer of Al or AlCu upon the Cu bonding pads in an integrated circuit.

FIG. 8 is a partial cross-sectional view of IC 80. In FIG. 8, a Cu bonding pad 82 is formed over a first barrier layer 85 with damascene process. In addition, a passivation layer 84 over a nonconductive layer 86 is etched to expose the Cu bonding pad 82 through a contact window 88. In-situ $H_2/N_2$ (or $NH_3$) gas or plasma can reduce the thin Cu oxide layer over the pad surface, which oxides during the etched back process.

Figure 9:
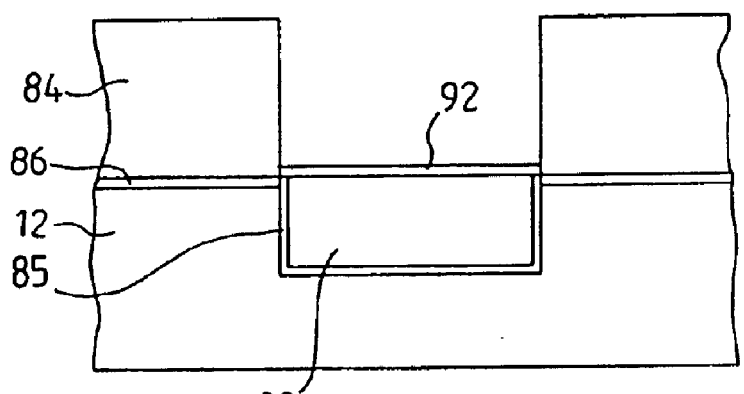

In FIG. 9, a second barrier layer of tungsten 92, which is thinner than 20 nm, is selectively deposited on the Cu pads 82 by CVD process.

Figure 10:
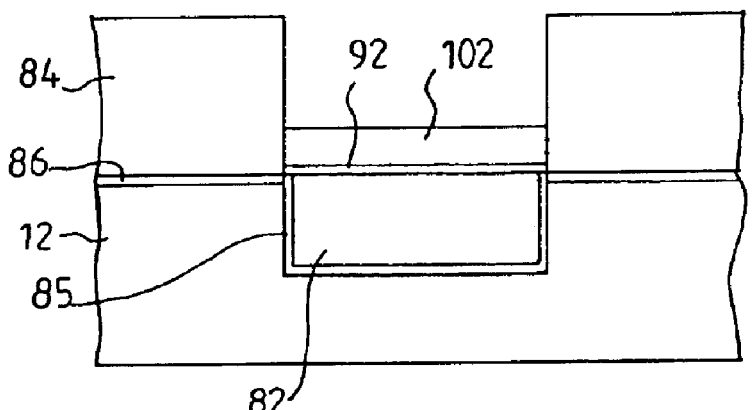

After that, as shown in FIG. 10, an Al or AlCu layer 102, 150–200 nm in thickness, is selectively deposited by CVD in-situ or ex-situ on the second barrier layer of W 92. The Al or AlCu layer is used as an glue layer with Au-ball to improve the bondability between Au-ball and Cu pads. Therefore, a Al or AlCu layer 102 over Cu bonding pad 82 with both protective and glue function is formed, which improves the bondability between Al-ball and Cu pads.

The advantage of the selective deposition is to eliminate the some processes such as CMP.

An additional polishing step is performed to intentionally introduce surface roughness such as scratches on dielectric surface. (not shown in the figures) The self-aligned process is less expensive than conventional approach; the new process does not need photo and etching steps.

EXAMPLE 3

The preferred embodiment is to deposit a self-aligned layer of Al or AlCu upon the Cu bonding pads, which is made by means of Cu damascene process on the top metal structure for packaging of chips.

Figure 11:
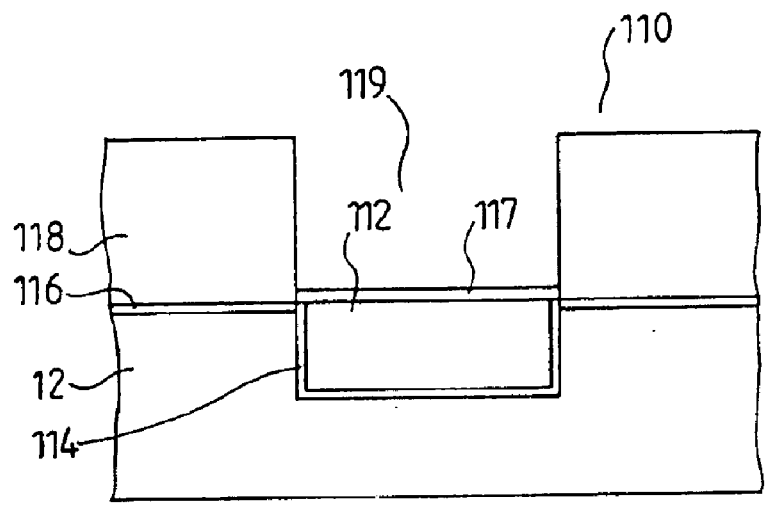
FIG. 11 through FIG. 13 illustrate steps in a method of forming a layer of Al or AlCu over the Cu bonding pads and the surface of windows-hole sidewalls in an integrated circuit.

FIG. 11 is a cross-sectional view of IC 110 depicting a passivation layer is etched to expose a Cu pad 112 through a contact window 119. In FIG. 11, a Cu bonding pad 112 is formed over a first barrier layer 114 with damascene process and subsequently a layer of second barrier 117 is deposited on the top surface of Cu bonding pad 112. In addition, a passivation layer 118 over a nonconductive layer 116 is etched to expose the Cu bonding pad 112 through the contact window 119.

Figure 12:
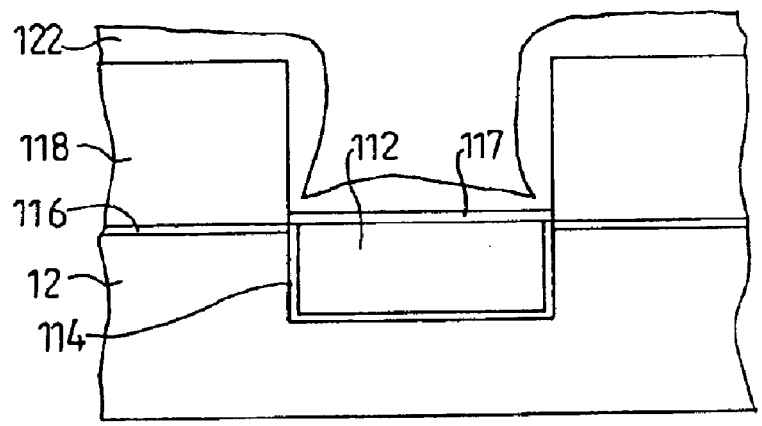
Figure 13:
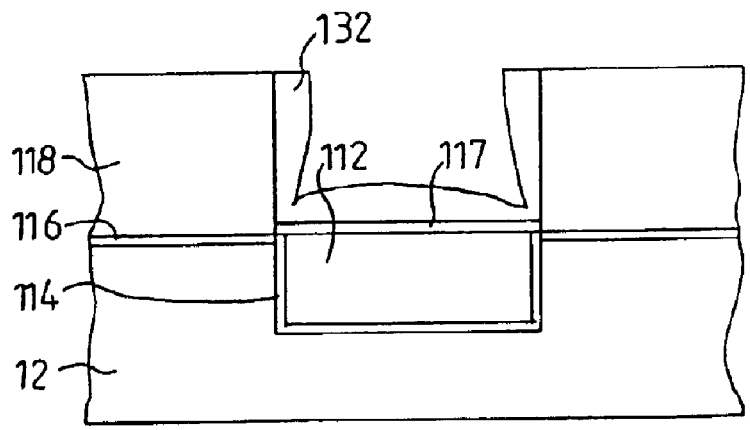

Next, blanket Al 122 is deposited on the passivation layer 118, as shown in FIG. 12. In FIG. 13, Al CMP is performed to remove Al on top surface of passivation layer 118 and leave a layer of Al 132 only on the Cu bonding pads 112 and sidewalls surfaces of contact windows 119.

After the Al CMP, an additional polishing step is performed to intentionally introduce surface roughness such as scratches on dielectric surface. (not shown in the figures) The self-aligned process is less expensive than conventional approach; the new process does not need photo and etching steps.

By the foregoing description, various processes embodying the present invention have been disclosed. However, numerous modifications and substitutions may be made without deviating from the scope of the present invention. Therefore, the above illustration is to disclose the present invention but not to limit the scope thereof.

What is claimed is:

1. A method of improving the bondability between gold (Au) wires and copper (Cu) pads used in semiconductor manufacturing process, said method comprising the steps of:
    forming a Cu bonding pad, on the top level of the metallization;
    chemical mechanical polishing (CMP) said Cu bonding pad;
    etching back said Cu bonding pad;
    depositing a barrier layer over said Cu bonding pad; and
    depositing AlCu or Al over said barrier layer to cover said Cu bonding pad.

2. A method according claim 1, wherein the material of said barrier layer is TiN.

3. A method according claim 2, wherein said TiN barrier layer is deposited by chemical Vapor Deposition (CVD) process.

4. A method according claim 2, wherein the thickness of said TiN barrier layer is less than 20 nm.

5. A method according claim 1, wherein the steps of said depositing a Al or AlCu layer is self-aligned depositing a Al or AlCu upon said barrier layer.

6. A method according to claim 1, wherein said method further comprises the steps of:
    CMP Al or AlCu over said Cu bonding pad;
    depositing a passivation layer over said top level metallization; and
    roughen the surface of said passivation layer.

* * * * *

UNITED STATES PATENT AND TRADEMARK OFFICE
CERTIFICATE OF CORRECTION

PATENT NO. : 6,753,259 B2
DATED : June 22, 2004
INVENTOR(S) : Syun-Ming Jang et al.

It is certified that error appears in the above-identified patent and that said Letters Patent is hereby corrected as shown below:

Title page,
Insert Item:
-- [74] *Attorney, Agent, or Firm*-Weingarten, Schurgin, Gagnebin & Lebovici LLP --.

Signed and Sealed this

Twenty-fourth Day of May, 2005

JON W. DUDAS
*Director of the United States Patent and Trademark Office*